United States Patent
Tsuno et al.

(10) Patent No.: US 10,121,634 B2
(45) Date of Patent: Nov. 6, 2018

(54) CHARGED PARTICLE BEAM DEVICE AND CHARGED PARTICLE BEAM MEASUREMENT METHOD

(71) Applicant: Hitachi High-Technologies Corporation, Minato-ku, Tokyo (JP)

(72) Inventors: Natsuki Tsuno, Tokyo (JP); Yoshinobu Kimura, Tokyo (JP); Hideyuki Kazumi, Tokyo (JP); Hajime Kawano, Tokyo (JP); Junichiro Tomizawa, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/021,039

(22) PCT Filed: May 30, 2014

(86) PCT No.: PCT/JP2014/064362
§ 371 (c)(1),
(2) Date: Mar. 10, 2016

(87) PCT Pub. No.: WO2015/037285
PCT Pub. Date: Mar. 19, 2015

(65) Prior Publication Data
US 2016/0225583 A1 Aug. 4, 2016

(30) Foreign Application Priority Data

Sep. 13, 2013 (JP) .................................. 2013-190000

(51) Int. Cl.
*H01J 37/244* (2006.01)
*H01J 37/28* (2006.01)
*H01J 37/26* (2006.01)

(52) U.S. Cl.
CPC ............ *H01J 37/28* (2013.01); *H01J 37/244* (2013.01); *H01J 37/265* (2013.01); *H01J 2237/043* (2013.01)

(58) Field of Classification Search
CPC ............. H01J 2237/043; H01J 2237/22; H01J 37/244; H01J 37/265; H01J 37/28; H01J 37/24585; H01J 37/2803
See application file for complete search history.

(56) References Cited

U.S. PATENT DOCUMENTS 8,841,612 B2 * 9/2014 Fukuda ................. H01J 37/222
 250/306
9,236,220 B2 * 1/2016 Tsuno ................... H01J 37/244
(Continued)

FOREIGN PATENT DOCUMENTS

JP 2-114439 A 4/1990
JP 4-337233 A 11/1992
(Continued)

OTHER PUBLICATIONS

International Search Report (PCT/ISA/210) issued in PCT Application No. PCT/JP2014/064362 dated Jul. 15, 2014 with English translation (four pages).

Primary Examiner — Wyatt Stoffa
(74) Attorney, Agent, or Firm — Crowell & Moring LLP

(57) ABSTRACT

An object of the present invention is to realize both of the accuracy of measuring the amount of secondary electron emissions and the stability of a charged particle beam image in a charged particle beam device. In a charged particle beam device, extraction of detected signals is started by a first trigger signal, the extraction of the detected signals is completed by a second trigger signal, the detected signals are sampled N times using N (N is a natural number) third trigger signals that equally divide an interval time T between the first trigger signal and the second trigger signal, second- (Continued)

ary charged particles are measured by integrating and averaging the signals sampled in respective division times $\Delta T$ obtained by equally dividing the interval time T, and the division time $\Delta T$ is controlled in such a manner that the measured number of secondary charged particles becomes larger than the minimum number of charged particles satisfying ergodicity.

14 Claims, 14 Drawing Sheets

(56) References Cited

U.S. PATENT DOCUMENTS

| | | |
|---|---|---|
| 2005/0253069 A1 | 11/2005 | Zewail et al. |
| 2007/0263223 A1* | 11/2007 | Hirai ............... H01J 37/244 356/450 |
| 2008/0017796 A1 | 1/2008 | Zewail et al. |
| 2009/0236521 A1 | 9/2009 | Zewail et al. |
| 2013/0126733 A1* | 5/2013 | Fukuda ............. H01J 37/222 250/310 |
| 2014/0097342 A1* | 4/2014 | Tsuno ............... H01J 37/28 250/307 |

FOREIGN PATENT DOCUMENTS

| | | |
|---|---|---|
| JP | 2011-108657 A | 6/2011 |
| JP | 2012-252913 A | 12/2012 |
| WO | WO 2005/098895 A2 | 10/2005 |

\* cited by examiner

CHARGED PARTICLE BEAM DEVICE AND CHARGED PARTICLE BEAM MEASUREMENT METHOD

TECHNICAL FIELD

The present invention relates to a charged particle beam device and a charged particle beam measurement method that observe a sample using a charged particle beam.

BACKGROUND ART

As a microscope by which a sample can be enlarged and observed, there is a charged particle microscope using a charged particle beam such as electrons or ions. In particular, a scanning electron microscope (hereinafter, abbreviated as SEM) that images by scanning an electron beam on a sample has been used for a sample analysis such as an observation of a fine surface shape or a local composition analysis. The SEM is a microscope that analyzes a sample in such a manner that an electron beam accelerated by a voltage applied to an electron source is irradiated onto the sample, and the focused electron beam (primary electrons) is scanned on the sample by a deflector.

In particular, when a target to be analyzed is an insulator, the sample is charged by the irradiation of the electron beam, resulting in image disturbance such as drift or shading. Accordingly, in order to perform a stable sample observation that is high in reproducibility, an electrification control technique by the irradiation of an electron beam is essential.

Further, the SEM is expected to observe a sample having a laminated structure. The amount of charges of a sample is dependent on electrical characteristics such as the capacity and resistance of the sample, and further reflects a structure buried in the laminated structure or an interface of the laminated structure. Thus, the buried structure or the interface of the laminated structure can be observed by extracting the potential contrast due to the electrification of the sample.

As a related technique, Patent Literature 1 focuses on the fact that an image reflecting the buried structure appears in a specific time region in which a difference between secondary electron signals occurs, and describes a technique in which a sample is charged by intermittently irradiating an electron beam to select a secondary electron signal reflecting necessary sample information on the basis of a detection time. As an example of the detection time, an embodiment in which a detection time of 0.2 ms relative to a pulse irradiation electron having a pulse width of 0.5 ms is set and an embodiment in which a detection time of 0.05 ms in synchronization with a pulse having a pulse width of 0.05 ms is set are described.

CITATION LIST

Patent Literature

PTL 1: Japanese Patent Application Laid-Open Publication No. 2012-252913

SUMMARY OF INVENTION

Technical Problem

In Patent Literature 1, it is important to control the time width for high-accuracy detection because the secondary electron signal caused by the laminated structure is extracted on the basis of the detection time width. In particular, if the time width can be made much shorter, the secondary electron signal adapting to a finer laminated structure can be extracted. Thus, more significant information can be obtained.

Further, the electrification of the sample proceeds as needed during the irradiation of the electron beam. Accordingly, if the detection time width can be shortened, it is advantageous in reducing the image disturbance such as drift or shading. This aspect can be applied to a case in which the laminated structure is observed or not observed.

However, the inventors of the application found that the time width cannot be indefinitely shortened. The details thereof will be described in the following embodiments. When the time width is shortened, the average value of detected signals becomes extremely unstable from a certain time width, and largely varies in each measurement. Thus, it is necessary to control the time width in consideration of the condition.

On the basis of the above description, an object of the present invention is to realize high-accuracy detection while securing the stability of detected signals in a charged particle beam device or a charged particle beam measurement method.

Solution to Problem

The following exemplifications are representative solutions to problems of the invention of the application. The present invention provides a charged particle beam device including: a charged particle source that generates a primary charged particle beam; a stage on which a sample is put; an acceleration voltage setting unit that sets the acceleration voltage of the primary charged particle beam; an objective lens that focuses the primary charged particle beam to a sample; a detector that detects secondary charged particles emitted from the sample; a detection control unit that extracts detected signals obtained by the detector; and a trigger signal control unit that transmits a trigger signal to the detection control unit, characterized in that the detection control unit: controls to start the extraction of the detected signals using a first trigger signal generated by the trigger signal control unit; controls to complete the extraction of the detected signals using a second trigger signal generated by the trigger signal control unit; controls to sample the detected signals N times using N (N is a natural number) third trigger signals that are generated by the trigger signal control unit and that equally divide an interval time T between the first trigger signal and the second trigger signal; and controls to measure the secondary charged particles by integrating and averaging the signals sampled in respective division times $\Delta T$ obtained by equally dividing the interval time T, and the division time $\Delta T$ is controlled in such a manner that the number of primary charged particles contained in the division time $\Delta T$ becomes larger than the minimum number of charged particles satisfying ergodicity.

Alternatively, the present invention provides a charged particle beam measurement method in a charged particle beam device having a charged particle source that generates a primary charged particle beam, a stage on which a sample is put, an acceleration voltage setting unit that sets the accelerating voltage of the primary charged particle beam, an objective lens that focuses the primary charged particle beam onto a sample, a detector that detects secondary charged particles emitted from the sample, a detection control unit that extracts detected signals obtained by the detector, and a trigger signal control unit that transmits a trigger signal to the detection control unit, the method including: a step of starting the extraction of the detected signals using a first trigger signal generated by the trigger signal control unit; a step of completing the extraction of the detected signals using a second trigger signal generated by the trigger signal control unit; a step of sampling the detected signals N times using N (N is a natural number) third trigger signals that are generated by the trigger signal control unit and that equally divide an interval time T between the first trigger signal and the second trigger signal; and a step of measuring the secondary charged particles by integrating and averaging the signals sampled in respective division times ΔT obtained by equally dividing the interval time T, and the division time ΔT is controlled in such a manner that the measured number of secondary charged particles becomes larger than the minimum number of charged particles satisfying ergodicity.

Advantageous Effects of Invention

According to the invention of the application, high-accuracy detection can be realized while securing the stability of detected signals in a charged particle beam device or a charged particle beam measurement method.

DESCRIPTION OF EMBODIMENTS

Hereinafter, embodiments of the present invention will be described using the drawings.

First Embodiment

Figure 1:
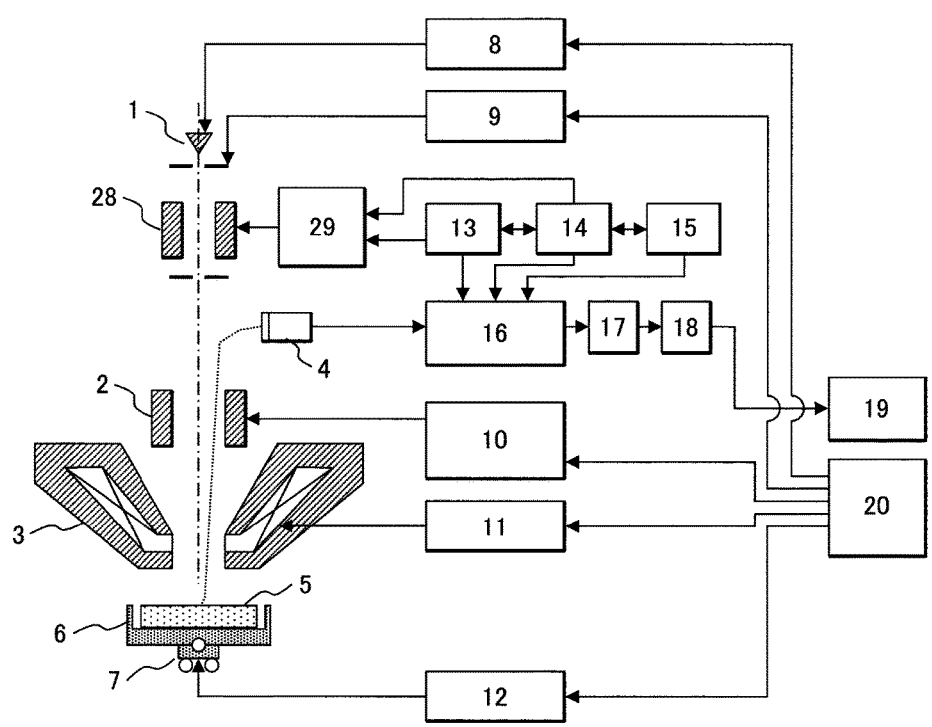
FIG. 1 is a configuration diagram for showing an example of a charged particle beam device according to a first embodiment.

In the embodiment, a measurement device and method for the amount of secondary electron emissions in which a time reference is provided will be described using an example of a scanning electron microscope among charged particle beam devices. A configuration example of a scanning electron microscope according to the embodiment is shown in FIG. 1. The scanning electron microscope has an electron optical system, a stage mechanism system, an SEM control system, a trigger signal control system, a signal processing system, an SEM operation system, and an electron irradiation control system.

The electron optical system includes an electron gun 1, a deflector 2, an objective lens 3, and a detector 4. The stage mechanism system includes a sample holder 6 in which a sample 5 is put, and a stage 7 whose inclination can be controlled and which can be moved in the X, Y, and Z axis directions. The SEM control system includes an acceleration voltage control unit 8 for the electron gun, a current control unit 9 for primary electrons, a deflection scanning signal control unit 10, an objective lens coil control unit 11, and a stage control unit 12. The trigger signal control system includes a first trigger signal control unit 13, a second trigger signal control unit 14, and a third trigger signal control unit 15. The signal processing system includes a detection control unit 16, a signal processing unit 17, and a signal voltage conversion unit 18. The operation system includes a measurement result display unit 19 and an operation interface 20. The electron beam irradiation control system includes a blanker 28 that blocks an electron beam and a blanker control unit 29.

In the present invention, in order to form the potential contrast with electrification controlled by stabilizing the amount of secondary electron emissions, plural trigger signals serving as time reference signals are generated, and the electron beam irradiation control system and a detection control system for secondary electrons are synchronized with the trigger signals. Accordingly, the irradiation, detection, and scanning of an electron beam necessary for the measurement of the amount of secondary electron emissions are controlled.

Figure 2:
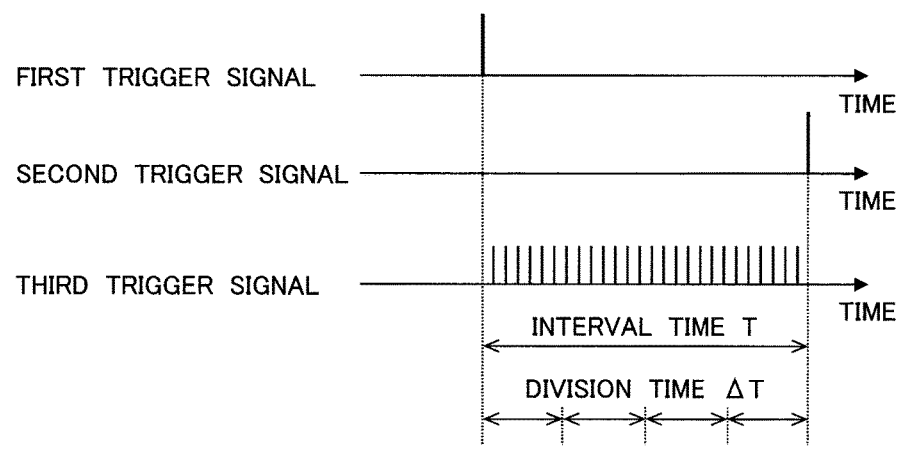
FIG. 2 is a diagram for showing a control method of the charged particle beam device according to the present invention.

FIG. 2 shows a control method for the scanning electron microscope according to the embodiment. First, the trigger signal control units 13 and 14 transmit a first trigger signal and a second trigger signal serving as a time reference for detection of secondary electrons to the detection control unit. Here, an interval between the first trigger signal and the second trigger signal is represented as an interval time T. In this case, the number of irradiated electrons Ne contained between the first trigger signal and the second trigger signal is represented as the equation (1).

$$Ne = T \times Ip/e \qquad (1)$$

wherein Ip represents the current of primary charged particles and e represents an elementary charge.

Further, the trigger signal control unit 15 transmits a third trigger signal that equally divides the interval time T to the detection control unit 16. Here, the number of generated third trigger signals contained in the interval time T is represented as N. Here, when the number of generated signals N is set at the number of irradiated electrons Ne or larger contained in the interval time T, the detected signals can be extracted using the third trigger signals without omission of extraction.

Then, the detection control unit 16 starts sampling by opening a gate using the first trigger signal, the detected signals from the detector are sampled N times in synchronization with the third trigger signals, and the sampling is completed with the second trigger signal. After the completion of the sampling, the detected signals sampled on the basis of the third trigger signals are integrated in the range of a division time Δ, and an integrated value to be obtained is calculated. Further, the integrated value is averaged using the division time Δ to measure the amount of secondary electron emissions.

Figure 3A:
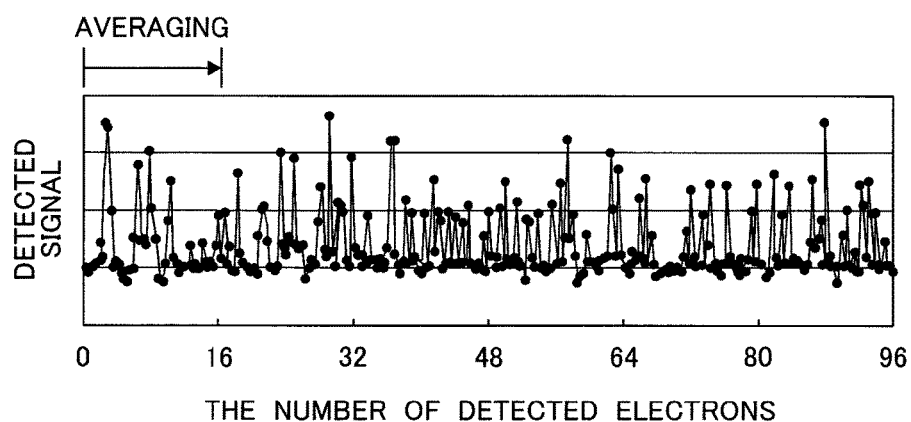
FIG. 3A is a diagram for showing a relation between the number of detected electrons and detected signals.
Figure 3B:
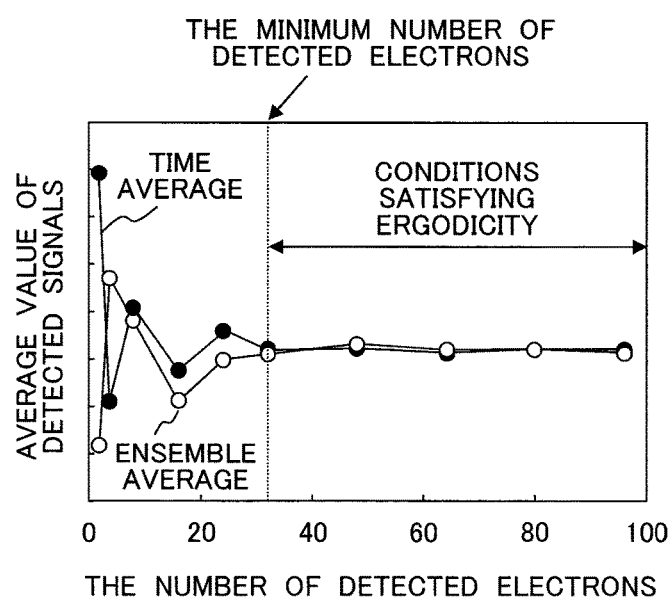
FIG. 3B is a diagram for showing a relation between the number of detected electrons and detected signals.

Here, FIG. 3A shows a relation between the number of detected electrons and the detected signals measured by the inventors of the application prior to the present invention, and FIG. 3B shows a relation between the number of detected electrons and the average value of the detected signals. FIG. 3B shows a result obtained by analyzing with a time average in the case where the detected signals were averaged in an arbitrary time width and an ensemble average in the case where the detected signals were averaged by detecting the same plural times at arbitrary timing. As being apparent from FIG. 3B, in the case where the number of detected electrons is smaller than a predetermined number (the minimum number of detected electrons) in the both of the time average and the ensemble average, the average value of the detected signals is unstable and varies in each measurement. This is due to quantum behavior of the electrons under the condition where the number of electrons is small. Under such an unstable condition, it is impossible to distinguish the signal obtained on the basis of the structure of the sample from that obtained on the basis of the quantum behavior of the electrons. The condition in which the quantum behavior settles and is converged to a constant value is referred to as ergodicity which represents a state in which the time average value is equal to the ensemble average value. It should be noted that values between the equal value and the square root of the number of signals sampled in the range of the division time Δ are accepted as the range of variation. The shortest time width in which the signal caused by the structure of the sample can be determined on the basis of the minimum number of detected electrons satisfying the ergodicity.

Namely, when the scanning electron microscope according to the embodiment controls the measurement of secondary electrons in such a manner that the detected signals are sampled N times using the N (N is a natural number) third trigger signals that equally divide the interval time T and the signals sampled in the respective division times ΔT obtained by equally dividing the interval time T are integrated and averaged, the division time ΔT may be controlled so that the number of primary electrons (Ne×ΔT/T) contained in the division time ΔT becomes larger than the minimum number of electrons satisfying the ergodicity.

If the division time ΔT is determined in such a manner, the secondary electron signal corresponding to a finer structure can be extracted, and the quantum behavior of the electrons can be prevented. Here, the minimum number of detected electrons satisfying the ergodicity differs depending on a device or the irradiation conditions of an electron beam. Thus, it is necessary for the irradiation control system and the detection control system to control the number of detected electrons in consideration of the irradiation conditions.

Figure 4:
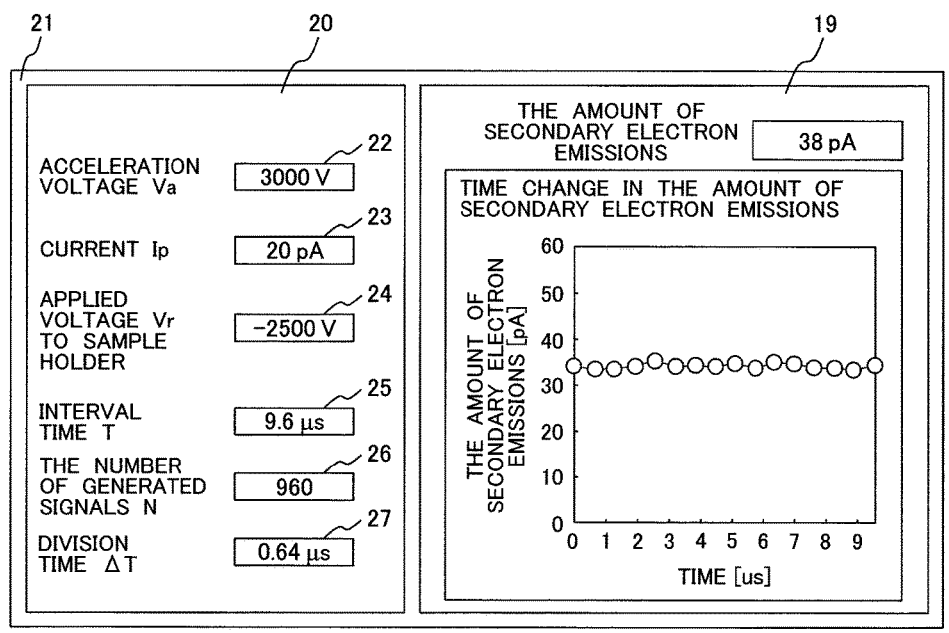
FIG. 4 is a diagram for showing an example of a GUI of the charged particle beam device according to the first embodiment.

FIG. 4 shows a GUI 21 for the measurement of the amount of secondary electron emissions. The GUI 21 includes an operation interface 20 and a measurement result display unit 19, and has an acceleration voltage setting unit 22, a current setting unit 23 of primary electrons, an applied voltage setting unit 24 to a sample holder, an interval time setting unit 25 that inputs the interval time T, a generation number setting unit 26 that inputs the number of generated signals N, a division time setting unit 27 that inputs the division time ΔT, a measurement result display unit 28 of the ratio of secondary electron emissions, and a measurement result display unit 19 of the amount of secondary electron emissions.

Figure 5:
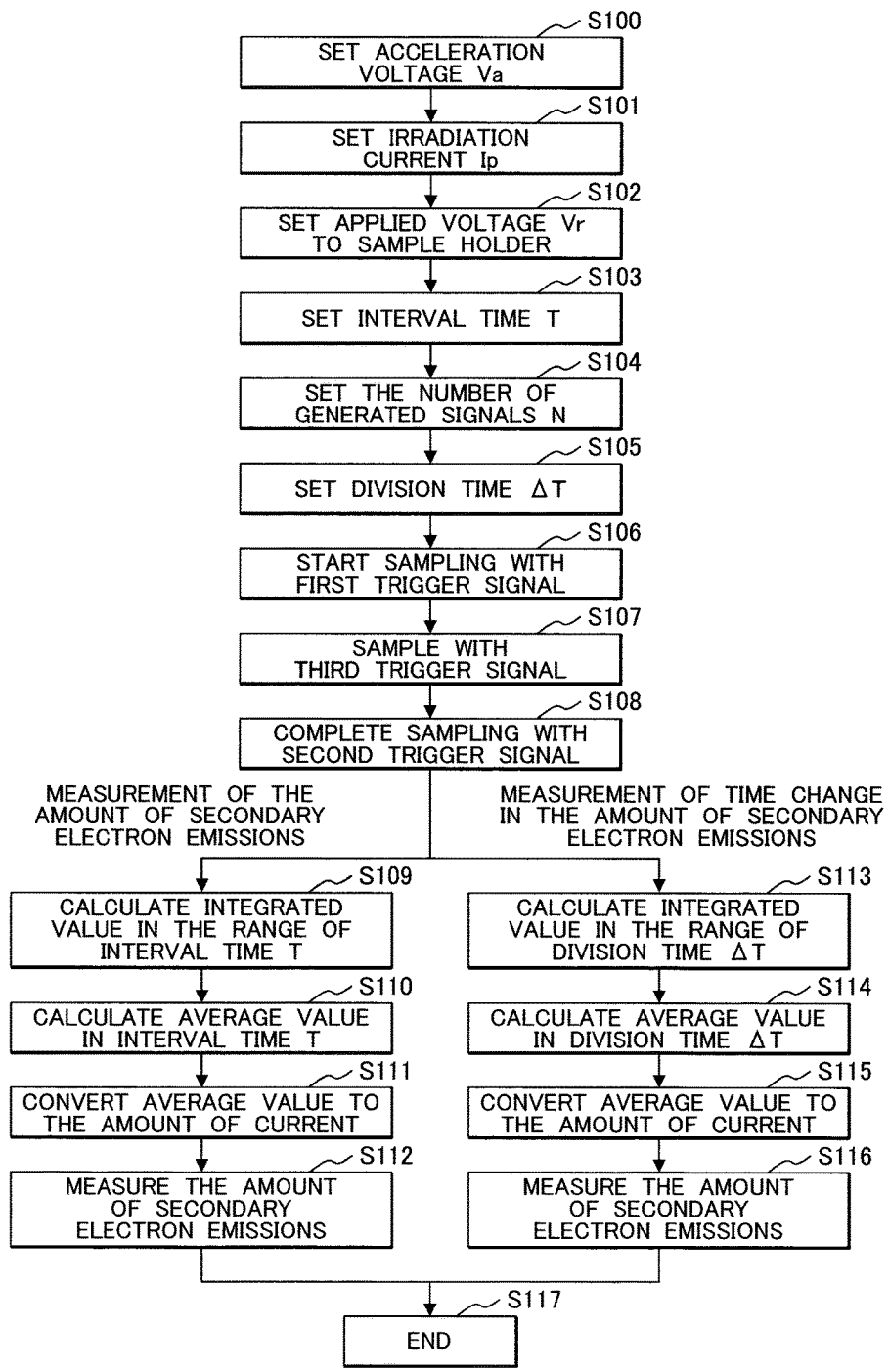
FIG. 5 is a flowchart for showing an example of a measurement using the charged particle beam device according to the first embodiment.

FIG. 5 shows a measurement flow of the amount of secondary electron emissions using the scanning electron microscope. First, in the flow, the acceleration voltage setting unit 22 sets an acceleration voltage Va (Step S100), the current setting unit 23 of primary electrons sets a current Ip of primary electrons (Step S101), and the applied voltage setting unit 24 to a sample holder sets an applied voltage Vr to the sample holder (Step S102). In FIG. 5, Va, IP, and Vr were 3000 V, 20 pA, and −2500V, respectively. Further, the interval time setting unit 25 sets the interval time T (Step S103), the generation number setting unit 26 sets the number of generated signals N (Step S104), and the division time setting unit 27 sets the division time ΔT (Step S105). Here, in order to extract the detected signals using the third trigger signals without omission of extraction, the number of generated signals N is desirably the number of irradiated electrons Ne or larger contained in the interval time T. The number of irradiated electrons Ne can be calculated using the equation (1). In the embodiment, a method in which a user input the number of generated signals N was employed. However, automatic setting using the equation (1) may be employed. In FIG. 5, T, N, and ΔT were 9.6 μs, 960, and 0.64 μs, respectively. As described above, the division time ΔT is a measurement time unit to measure a time change in the amount of secondary electron emissions. Thus, the division time ΔT needs to be set at a time width or larger satisfying the ergodicity in which the average value is equal to the ensemble average of the detected signals. In the scanning electron microscope used in the embodiment, the time width satisfying the ergodicity was an experimental value of 0.20 μs or larger. Thus, the setting value of the division time ΔT satisfies the ergodicity in the averaging process of signals. The electron beam emitted from the electron gun 1 using the acceleration voltage Va and the current Ip of primary electrons is focused onto the objective lens 3, and is attenuated by the applied voltage Vr to the sample holder to be irradiated onto the sample 5. Here, the irradiation energy to the sample is calculated on the basis of a difference between the absolute values of Va and Vr, and is 500 eV in FIG. 5. Further, the irradiation position of the electron beam on the sample 5 is controlled by the deflector 2. Further, the secondary electrons emitted from the sample 5 by the irradiation of the electron beam are detected by the detector 4. The detection control unit 16 extracts detected signals from analog detected signals obtained by the detector 4. Here, the timing of starting the extraction of the detected signals is controlled by the first trigger signal received from the first trigger signal control unit 13 (Step S106). The detected signals are sampled N times on the basis of the third trigger signals received from the third trigger signal control unit 15 (Step S107). Further, the extraction of the detected signals is completed by the second trigger signal received from the second trigger signal control unit 14 (Step S108). Next, the voltage signal of the secondary electrons extracted by the detection control unit 16 is integrated by the signal processing unit 17. First, a case in which the amount of secondary electron emissions is measured will be described. The voltage signal of the secondary electrons is integrated in the range of the interval time T, and the integrated value is calculated (Step S109). Next, the average value is calculated using the integrated value and the interval time T (Step S110). Further, the average value is converted into a current (Step S111), and the amount of secondary electron emissions is measured (Step S112). Next, a case in which a time change in the amount of secondary electron emissions is measured will be described. The voltage signal of the secondary electrons extracted by the detection control unit 16 is integrated in the range of the division time $\Delta T$ to calculate the integrated value (Step S113). The number of integrated values to be calculated corresponds to a number obtained by dividing the interval time T by the division time $\Delta T$. In the embodiment, 15 integrated values can be obtained. Next, the average value is calculated using the integrated value and the division time $\Delta T$ (Step S114), and the average value is converted into a current (Step S115). Accordingly, the time change can be measured by calculating the amount of secondary electron emissions (Step S116). Then, the flow is completed (Step S117).

The amount of secondary electron emissions of silicon and the measurement result of the time change in the amount of secondary electron emissions are displayed on the measurement result display unit 28 for the ratio of secondary electron emissions of FIG. 4. It is obvious from FIG. 4 that the time change in the ratio of secondary electron emissions can be measured with a time resolution of 0.64 µs of the division time satisfying the ergodicity. As described above, according to the embodiment, the detection can be controlled while setting a time reference, and thus the time change in the amount of secondary electron emissions can be analyzed while realizing high-accuracy detection in a shorter time width.

Figure 6:
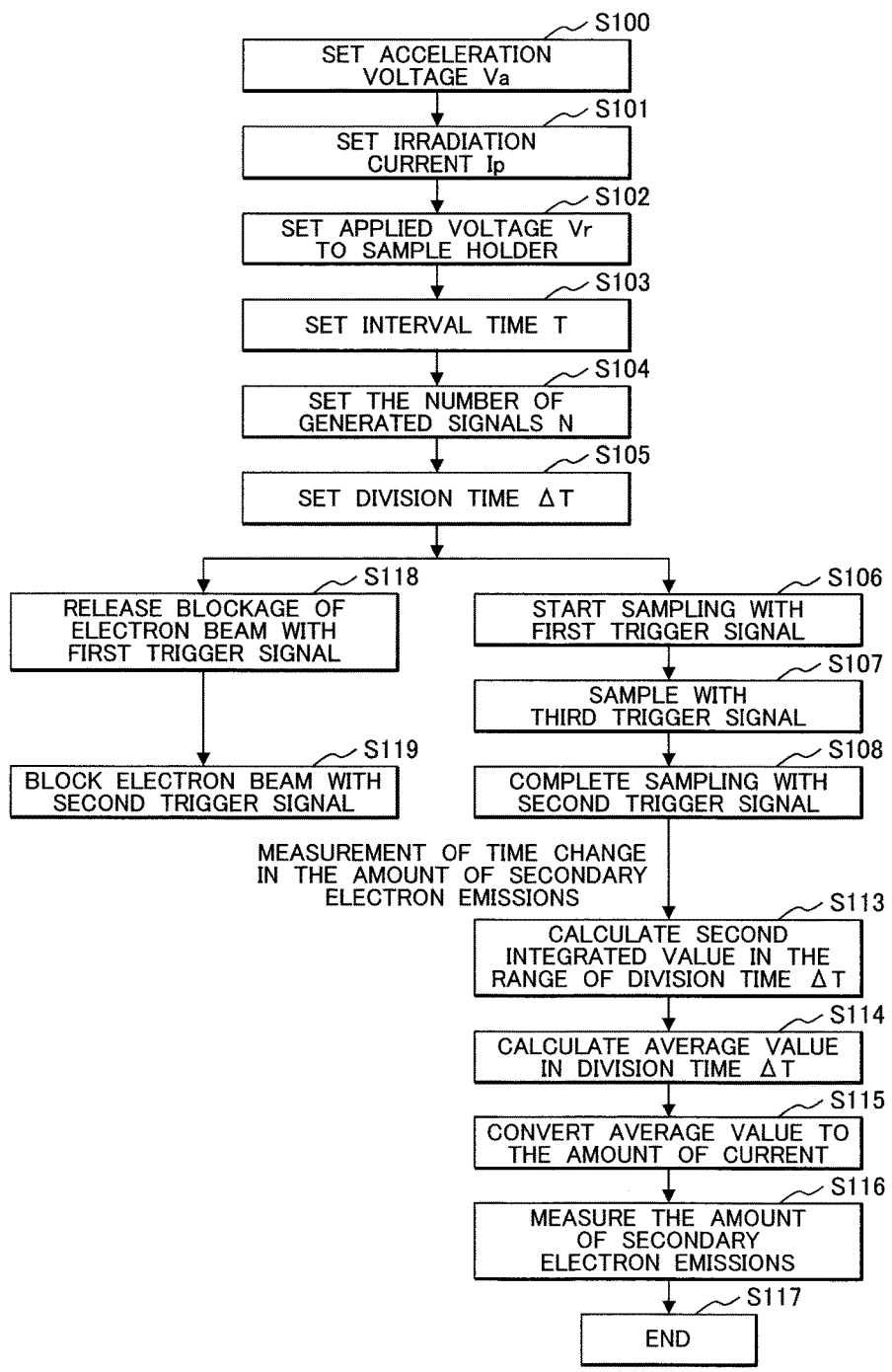
FIG. 6 is a flowchart for showing an example of a measurement using the charged particle beam device according to the first embodiment.

Next, a measurement flow of the amount of secondary electron emissions in which the irradiation and detection of an electron beam are controlled while setting a time reference will be described using FIG. 6. The acceleration voltage setting unit 22 sets the acceleration voltage Va (Step S100), the current setting unit 23 of primary electrons sets the current Ip of primary electrons (Step S101), and the applied voltage setting unit 24 to a sample holder sets the applied voltage Vr to the sample holder (Step S102). In FIG. 6, Va, Ip, and Vr were 10000 V, 10 pA, and −9700 V, respectively. Further, the interval time setting unit 25 sets the interval time T (Step S103), the generation number setting unit 26 sets the number of generated signals N (Step S104), and the division time setting unit 27 sets the division time $\Delta T$ (Step S105). In FIG. 6, T, N, and $\Delta T$ were 64 µs, 6400, and 0.64 µs, respectively. In the scanning electron microscope used in the embodiment, the time width satisfying the ergodicity was an experimental value of 0.40 µs or larger, and the setting value of the division time $\Delta T$ satisfies the ergodicity in the averaging process of signals. The electron beam emitted from the electron gun 1 using the acceleration voltage Va and the current Ip of primary electrons is focused onto the objective lens 3, and is attenuated by the applied voltage Vr to the sample holder to be irradiated onto the sample 5. Here, the electron beam can be blocked by the blanker 28 installed immediately below the electron gun 1. The irradiation and blockage of the electron beam are controlled by a blanker voltage generated from the blanker control unit 29. In FIG. 6, the blanker 28 is controlled in such a manner that the electron beam is irradiated only between the first trigger signal and the second trigger signal, and thus the electron beam becomes a pulse with a time width T.

The timing of irradiating the electron beam is controlled by the first trigger signal received from the first trigger signal control unit 13 (Step S118). In this case, the secondary electrons emitted from the sample 5 by the irradiation of the electron beam are detected by the detector 4. The detection control unit 16 extracts detected signals from analog detected signals obtained by the detector 4. Here, the timing of starting the extraction of the detected signals is controlled by the first trigger signal received from the first trigger signal control unit 13 (Step S106).

Namely, both of the timing of irradiating the electron beam and the timing of starting the extraction of the detected signals are controlled by the first trigger signal. Thus, the timing of irradiating the electron beam and the timing of starting the extraction of the detected signals can be synchronized with each other. The detected signals are sampled N times using the third trigger signals received from the third trigger signal control unit 15 (Step S107). Further, the extraction of the detected signals is completed by the second trigger signal received from the second trigger signal control unit 14 (Step S108). At the same time, the electron beam is blocked using the second trigger signal (Step S119). Namely, when the extraction of the detected signals is completed, the electron beam is blocked. Thus, excessive irradiation generated except the time of detection can be suppressed. In FIG. 6, the time change in the amount of secondary electron emissions is measured. The flows of measuring the time change in the amount of secondary electron emissions are the same as those of Step S113 to Step S116 shown in FIG. 5.

Figure 7:
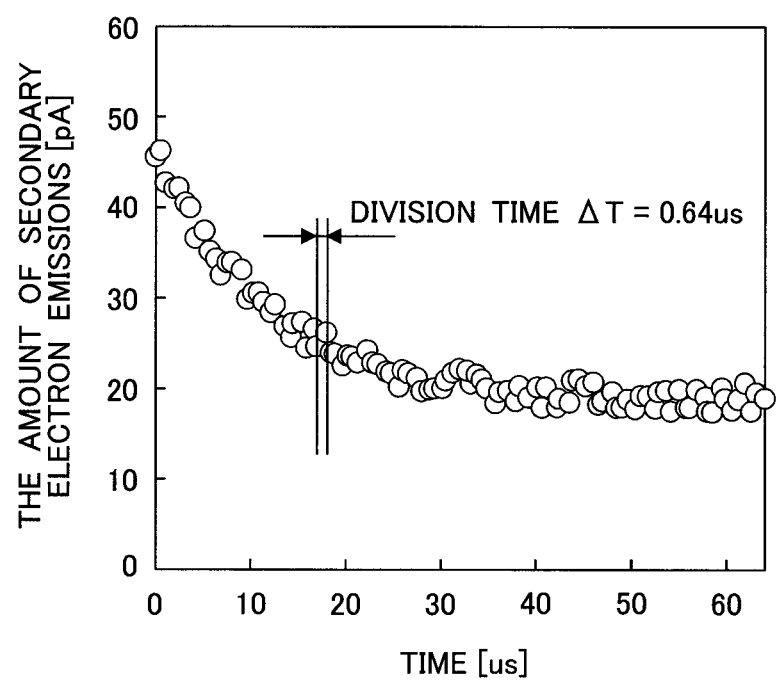
FIG. 7 is a diagram for showing an example of a measurement result according to the first embodiment.

FIG. 7 shows a time change in the amount of secondary electron emissions of $SiO_2$ that is the measurement result in the flow of FIG. 6. It can be understood that the time change in the amount of secondary electron emissions of $SiO_2$ that is an insulator can be measured with a time resolution of 0.64 µs. Further, it can be understood that the amount of secondary electron emissions of $SiO_2$ is reduced by electrification by the irradiation of the electron beam, and is steady in a state where the amount of secondary electron emissions is balanced with a current of 20 pA of primary electrons. As described above, according to the embodiment, the irradiation and detection can be controlled while setting a time reference, and thus the time change in the amount of secondary electron emissions of an insulator can be analyzed while realizing high-accuracy detection in a shorter time width.

On the basis of the above description, the charged particle beam device according to the embodiment has the charged particle source (electron gun 1) that generates a primary charged particle beam, the stage (7) on which a sample is put, the acceleration voltage setting unit (22) that sets the acceleration voltage of the primary charged particle beam, the objective lens (4) that focuses the primary charged particle beam onto the sample, the detector (4) that detects secondary charged particles emitted from the sample, the detection control unit (16) that extracts detected signals obtained by the detector, and the trigger signal control units (13 to 15) that transmit trigger signals to the detection control unit. The detection control unit controls to start the extraction of the detected signals using the first trigger signal generated by the trigger signal control unit, controls to complete the extraction of the detected signals using the second trigger signal generated by the trigger signal control unit, controls to sample the detected signals N times using the N (N is a natural number) third trigger signals that equally divide the interval time T between the first trigger signal and the second trigger signal generated by the trigger signal control unit, and controls to measure the secondary charged particles by integrating and averaging the signals sampled in the respective division times ΔT obtained by equally dividing the interval time T. In addition, the division time ΔT is controlled in such a manner that the number of primary charged particles contained in the division time ΔT is larger than the minimum number of charged particles satisfying the ergodicity.

According to the feature, high-accuracy detection can be performed in a shorter time width while reducing the influence of unstable behavior of the detected signals and the variation in each measurement.

Here, the minimum number of charged particles satisfying the ergodicity may be an equal value between the time average of the detected signals and the ensemble average of the detected signals in the measurement, or values between the equal value and the square root of the number of signals sampled in the range of the division time Δ.

Further, if the number of generated signals N is set at the number of charged particles contained in the primary charged particle beam within the interval time T, the detected signals can be extracted using the third trigger signals without omission of extraction.

Second Embodiment

Figure 8:
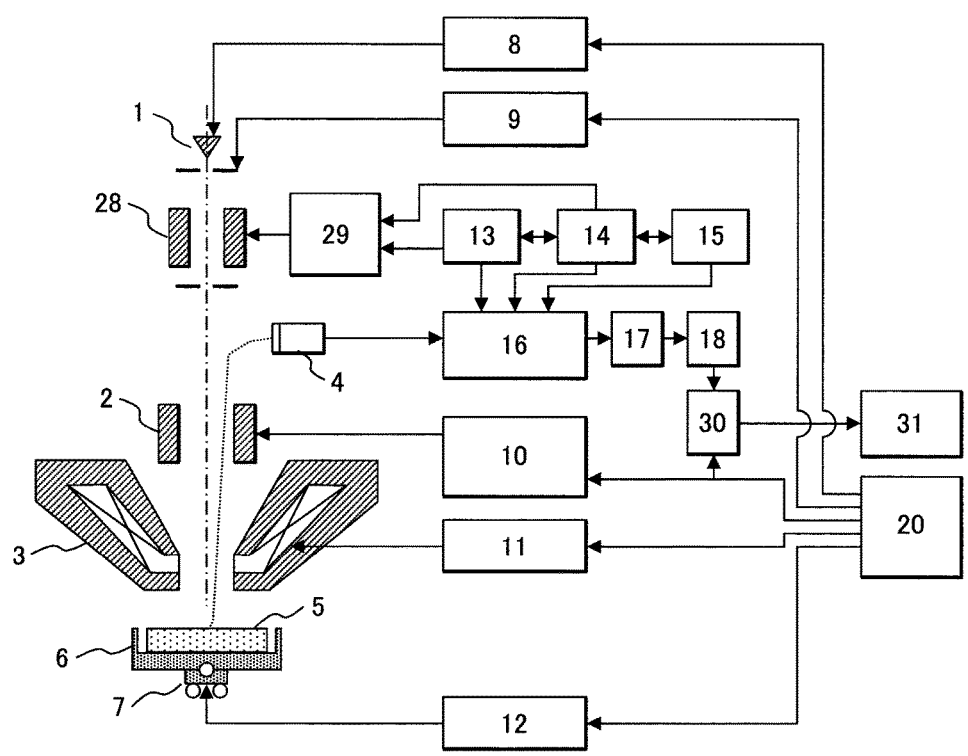
FIG. 8 is a configuration diagram for showing an example of a charged particle beam device according to a second embodiment.

In the embodiment, an image forming device and method in which the irradiation of a charged particle beam and the detection of secondary electrons are controlled while setting a time reference will be described. A configuration example of a scanning electron microscope in the embodiment is shown in FIG. 8. In addition to the configuration of FIG. 1, the scanning electron microscope of FIG. 8 further includes an image control system and an operation system. The image control system includes an image forming unit 30, and the operation system includes an image display unit 31 and an operation interface 20.

As similar to Step S100, Step S101, and Step S102 of FIG. 6, the acceleration voltage Va, the current Ip of primary electrons, and the applied voltage Vr to the sample holder are set as the settings of the observation conditions. In the embodiment, Va, Ip, and Vr were 5000 V, 10 pA, and −4700 V, respectively. Further, as similar to Step S103, Step S104, and Step S105 of FIG. 6, the interval time T, the number of generated signals N, and the division time ΔT are set.

Figure 9:
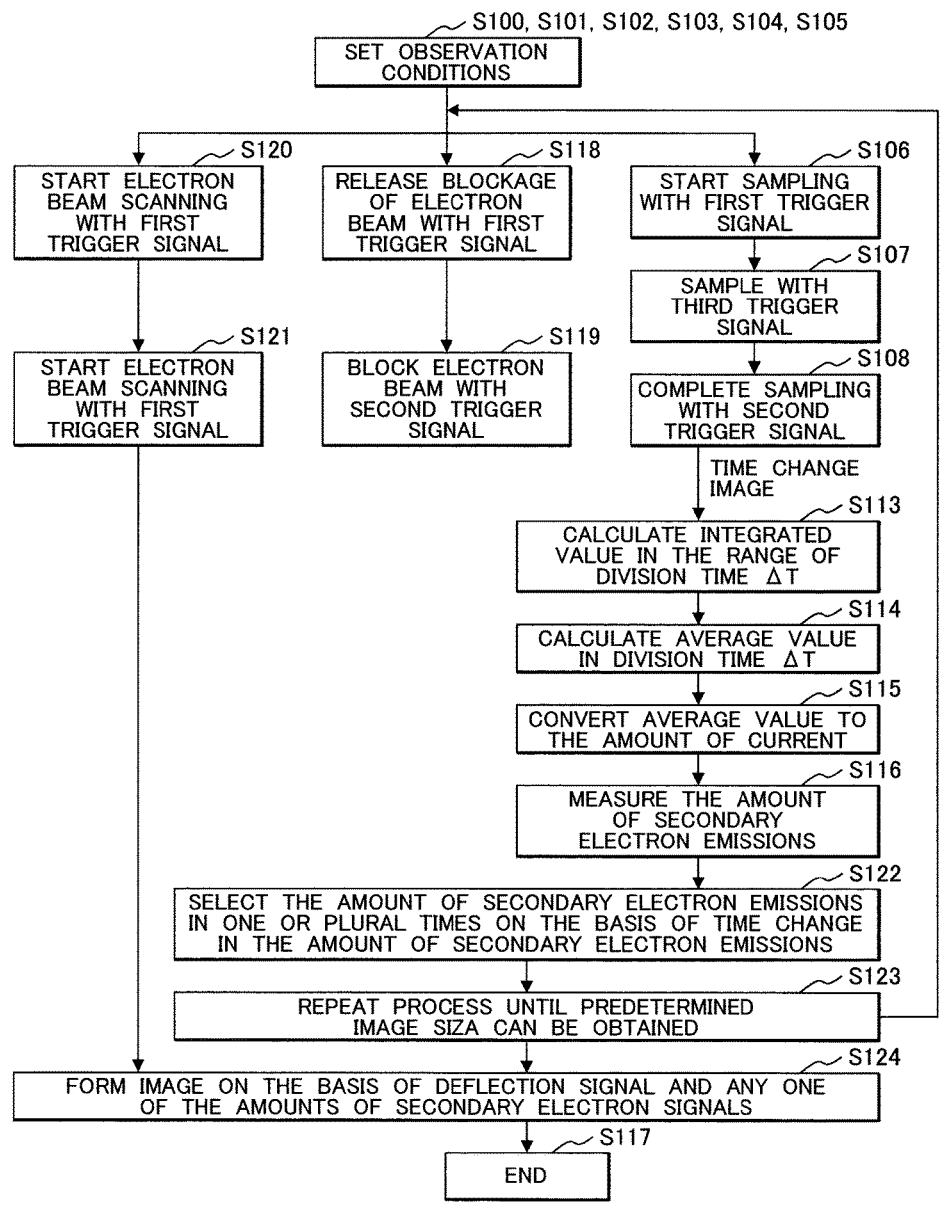
FIG. 9 is a flowchart for showing an example of a measurement using the charged particle beam device according to the second embodiment.

FIG. 9 shows a flow of forming an image while controlling the irradiation system, the detection system, and the deflection system on the basis of the setting values of the observation conditions. In FIG. 9, T, N, and ΔT were 32 µs, 3200, and 0.64 µs, respectively. In the scanning electron microscope used in the embodiment, the time width satisfying the ergodicity was an experimental value of 0.40 µs or larger, and the setting value of the division time ΔT satisfies the ergodicity in the averaging process of signals. The electron beam emitted from the electron gun 1 using the acceleration voltage Va and the current Ip of primary electrons is focused onto the objective lens 3, and is attenuated by the applied voltage Vr to the sample holder to be irradiated onto the sample 5. The deflector 2 allows the electron beam to two-dimensionally scan the sample 5. Further, the electron beam can be blocked by the blanker 28 installed immediately below the electron gun 1. The irradiation and blockage of the electron beam are controlled by a blanker voltage generated from the blanker control unit 29. The timing of deflecting the electron beam is controlled by the first trigger signal received from the first trigger signal control unit 13 (Step S120). The timing of irradiating the electron beam is controlled by the first trigger signal received from the first trigger signal control unit 13 (Step S118). In this case, the secondary electrons emitted from the sample 5 by the irradiation of the electron beam is detected by the detector 4. The detection control unit 16 extracts detected signals from analog detected signals obtained by the detector 4. Here, the timing of starting the extraction of the detected signals is controlled by the first trigger signal received from the first trigger signal control unit 13 (Step S106). Namely, the timing of deflecting the electron beam, the timing of irradiating the electron beam, and the timing of starting the extraction of the detected signals are controlled and synchronized with each other by the first trigger signal. The detected signals are sampled N times using the third trigger signals received from the third trigger signal control unit 15 (Step S107). Further, the extraction of the detected signals is completed by the second trigger signal received from the second trigger signal control unit 14 (Step S108). At the same time, the electron beam is blocked using the second trigger signal (Step S119), and the deflection of the electron beam is stopped. A time change in the amount of secondary electron emissions is measured using the extracted voltage signal of secondary electrons. As the flows of measuring the time change in the amount of secondary electron emissions, the flows of Step S113 to Step S116 shown in FIG. 5 were used. Next, the amount of secondary electron emissions in one or plural periods of time is selected on the basis of the time change in the amount of secondary electron emissions (S122). The measured amount of secondary electron emissions corresponds to a signal of one pixel. In order to obtain a desired image size, the deflection control (S120 and S121), the irradiation control (S118 and S119), the detection control (S106 to S108), and the measurement of the amount of secondary electron emissions (S113 to S116) are repeated, and the amount of secondary electron emissions is measured in each time while deflecting the electron beam (S123). An image is formed using the voltage value of the signal controlling the deflection and the secondary electrons (S124), and the flow is completed (S117).

Figure 10:
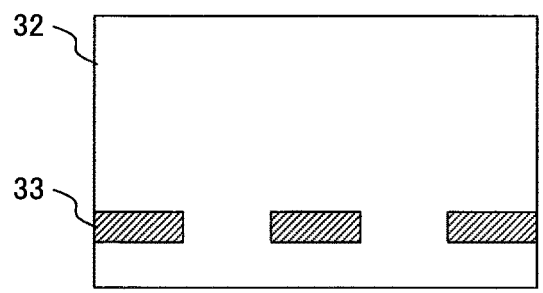
FIG. 10 is a cross-sectional view for showing an example of a structure of a sample.
Figure 11:
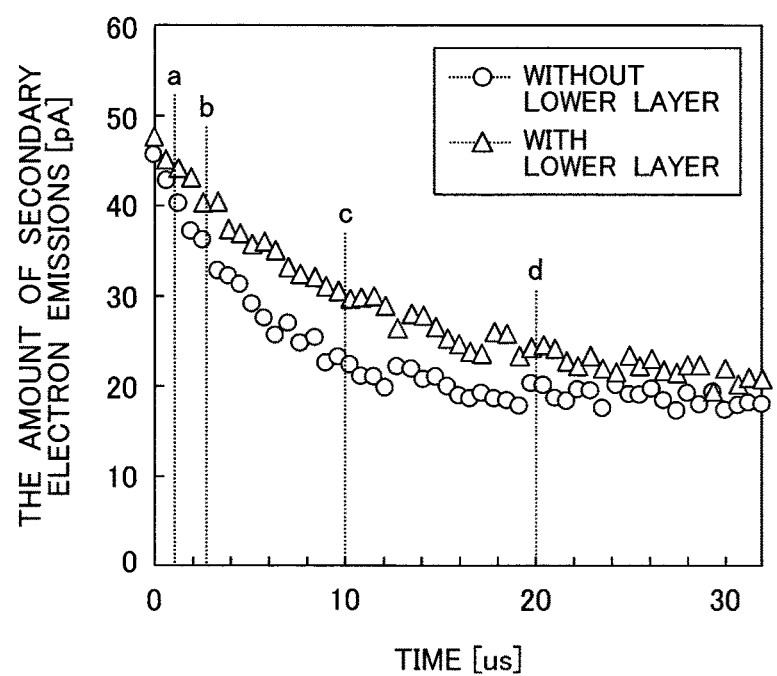
FIG. 11 is a diagram for showing an example of a measurement result according to the second embodiment.
Figure 12:
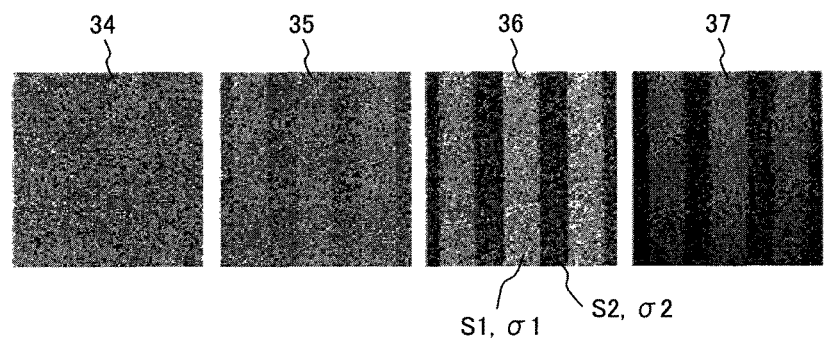
FIG. 12 is a diagram for showing an example of an image of the measurement result according to the second embodiment.

FIG. 10 shows a cross-sectional view of a sample structure in the embodiment. The sample of FIG. 10 is structured in such a manner that a lower layer pattern 33 is embedded into an insulating film 32. FIG. 11 shows a time change in the amount of secondary electron emissions measured at an area (with a lower layer) having the lower layer pattern and an area (without a lower layer) having no lower layer pattern. It can be understood from FIG. 11 that the difference between the amounts of secondary electron emissions at the area (with a lower layer) having the lower layer pattern and the area (without a lower layer) having no lower layer pattern becomes larger around 10 µs, and then becomes smaller again. This is because the time change in the amount of secondary electron emissions due to electrification differs depending on the laminated structure. FIG. 12 shows an SEM image in each selected time. The selected times are 1.28 µs (a of FIG. 11), 2.56 µs (b of FIG. 11), 10.24 µs (c of FIG. 11), and 20.48 µs (d of FIG. 11). The contrast value of each image was analyzed. The contrast was analyzed using the equation (2).

$$\text{Contrast}=(S1-S2)/(\sigma1+\sigma2)/2 \quad (2)$$

wherein S1 and σ1 represent the brightness of the image and the standard deviation in the area having no lower layer, respectively, and S2 and σ2 represent the brightness of the image and the standard deviation in the area having the lower layer, respectively. The contrast values of a 1.28 µs SEM image 34, a 2.56 µs SEM image 35, a 10.24 µs SEM image 36, and a 20.48 µs SEM image 37 are 0.1, 1.0, 2.3, and 1.7, respectively. The 10.24 µs SEM image 36 is the highest in the contrast of the lower layer pattern, and the condition is high in sensitivity to the lower layer pattern. In contrast, the 1.28 µs SEM image 34 is the lowest in the contrast of the lower layer pattern, and the condition is high in sensitivity to the shape of the surface. As described above, according to the embodiment, it is possible to form a charged particle beam image with the irradiation and electrification of the electron beam controlled by the detection control of the irradiation, detection, and deflection while setting the time reference.

Third Embodiment

In the embodiment, a measurement device and method of surface potential using the amount of secondary electron emissions will be described. The embodiment will be described using a scanning electron microscope as an example among charged particle beam devices. The same configuration as FIG. 1 was used for the scanning electron microscope in the embodiment.

Figure 13:
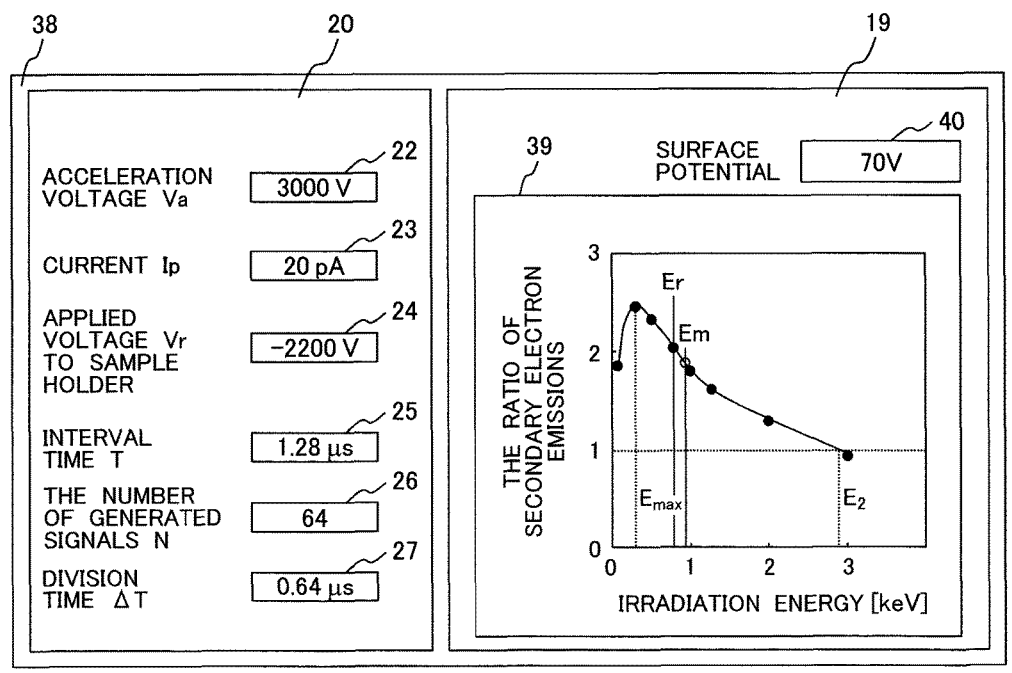
FIG. 13 is a diagram for showing an example of a GUI of a charged particle beam device according to a third embodiment.
Figure 14:
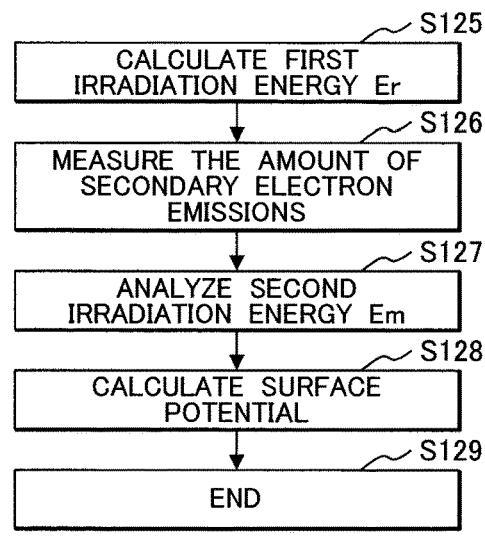
FIG. 14 is a flowchart for showing an example of a measurement using the charged particle beam device according to the third embodiment.

FIG. 13 shows a GUI 38 for a surface measurement. The GUI 38 includes an operation interface 20 and a measurement result display unit 19. The GUI 38 has an acceleration voltage setting unit 22, a current setting unit 23 of primary electrons, an applied voltage setting unit 24 to a sample holder, an interval time setting unit 25 that inputs an interval time T between a first trigger signal and a second trigger signal, a generation number setting unit 26 for the number of generated third trigger signals N, a division time setting unit 27 that equally divides the interval time, a measurement result display unit 39 of the amount of secondary electron emissions, and a surface potential measurement result display unit 40. FIG. 14 shows a flow of measuring the surface potential. A first irradiation energy Er is calculated on the basis of a difference between an acceleration voltage and an applied voltage to the sample holder (Step S125). In the embodiment, the acceleration voltage Va, the applied voltage Vr to the sample holder, and the first irradiation energy Er are 3000 V, 2200 V, and 800 V, respectively. In the measurement of the surface potential in the embodiment, the irradiation energy dependency (referred to as an yield curve) of the ratio of secondary electron emissions (the value obtained by dividing the amount of secondary electron emissions by the current of primary electrons) is used. As being apparent from the yield curve shown in the measurement result display unit 19 of FIG. 13, the ratio of secondary electron emissions is maximized around an irradiation energy of 300 eV, and becomes 1 around an irradiation energy of 3000 eV. The irradiation energy (E2) with which the ratio of secondary electron emissions becomes 1 can suppress the influence of electrification exerted on the sample by primary electrons. On the contrary, the irradiation energy (E2) is low in the irradiation energy dependency of the ratio of secondary electron emissions, and thus is not suitable for the potential measurement. In contrast, the irradiation energy between 300 eV and 3000 eV is high in the irradiation energy dependency of the ratio of secondary electron emissions, and is suitable for the potential measurement. However, the influence of electrification by primary electrons is inevitable. Accordingly, it is important to control the irradiation and detection in the potential measurement while setting a time reference. Therefore, the amount of secondary electron emissions is measured using the flow of FIG. 6 (Step S126). As the setting conditions of the embodiment, the acceleration voltage Va, the current Ip of primary electrons, and the applied voltage Vr to the sample holder were 3000 V, 20 pA, and 2200 V, respectively, and the interval time T, the number of generated signals N, and the division time ΔT were 1.28 µs, 128, and 0.64 µs, respectively.

The yield curve obtained in the reference section is shown in the measurement result display unit 39 of the amount of secondary electron emissions of FIG. 13. Next, the irradiation energy on the yield curve is extracted from the measured amount of secondary electron emissions to analyze a second irradiation energy Em. The surface potential corresponds to a difference between the first irradiation energy Er and the second irradiation energy Em. As described above, according to the embodiment, the surface potential can be measured with high potential resolution by measuring the amount of secondary electron emissions of an insulator.

Fourth Embodiment

Figure 15:
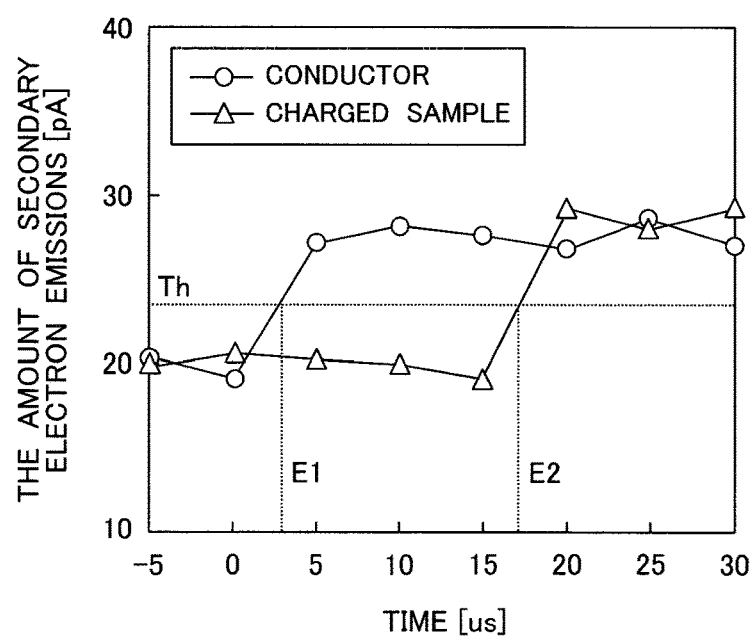
FIG. 15 is a diagram for showing an example of a measurement result according to a fourth embodiment.

In the embodiment, a measurement device and method of surface potential using the amount of secondary electron emissions will be described. The embodiment will be described using a scanning electron microscope as an example among charged particle beam devices. The same configuration as FIG. 1 was used for the scanning electron microscope in the embodiment. In the embodiment, a flow of measuring the surface potential of FIG. 14 was used. In the embodiment, an ultralow irradiation energy area between an irradiation energy with which an electron beam is reflected to become mirror electrons without being irradiated onto a sample and about 100 eV is used. An acceleration voltage Va with which the mirror electrons generated in such a manner that an electron beam is reflected without being irradiated onto the conductive sample can be detected and an applied voltage Vr to the sample holder are set. In the embodiment, Va and the applied voltage Vr to the sample holder are 3000 V and −3005V, respectively to measure the amount of secondary electron emissions. The amount of secondary electron emissions is measured while setting the acceleration voltage Va and the applied voltage Vr to the sample holder so as to gradually irradiate the electron beam onto the sample. In the embodiment, the amount of secondary electron emissions was obtained while changing Vr at 5 V pitch. The yield curve of the ultralow irradiation energy area calculated on the basis of a difference between the acceleration voltage Va and the applied voltage Vr to the sample holder is shown in FIG. 15. The irradiation energy when the amount of secondary electron emissions exceeds a constant threshold value Th is assumed as a first irradiation energy Er. Next, a second irradiation energy Em is analyzed on the basis of the yield curve measured on a charged sample. The surface potential is measured using the first irradiation energy Er and the second irradiation energy Em. As described above, according to the embodiment, the surface potential can be measured with high potential resolution by measuring the amount of secondary electron emissions of an insulator.

Fifth Embodiment

Figure 16:
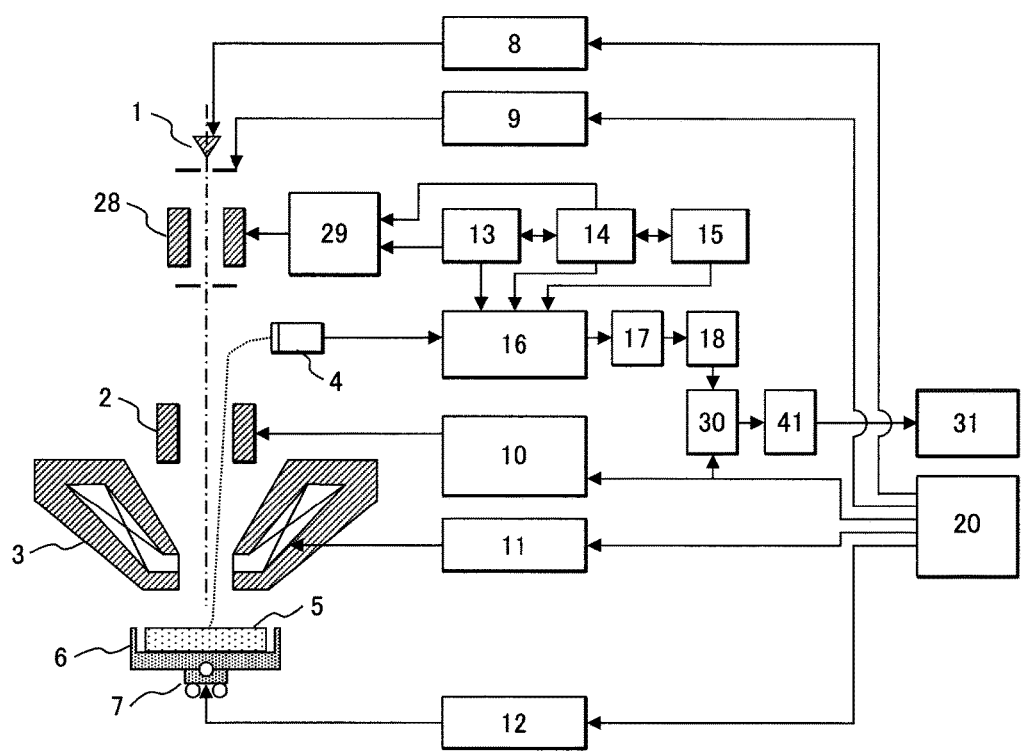
FIG. 16 is a configuration diagram for showing an example of a charged particle beam device according to a fifth embodiment.

In the embodiment, a measurement device and method of surface potential distribution using the amount of secondary electron emissions will be described. The embodiment will be described using a scanning electron microscope as an example among charged particle beam devices. The scanning electron microscope in the embodiment is shown in FIG. 16.

In the scanning electron microscope according to the embodiment, an image control system includes a conversion unit 41 that converts an image using the amount of secondary electron emissions to the surface potential distribution in addition to an image forming unit 30 using the amount of secondary electron emissions.

FIG. 18 shows a GUI 42 for the measurement of the surface potential distribution. The GUI 42 includes an operation interface 20 and an image display unit 31. The GUI 42 has an acceleration voltage setting unit 22, a current setting unit 23 of primary electrons, an applied voltage setting unit 24 to a sample holder, an interval time setting unit 25 that inputs an interval time T between a first trigger signal and a second trigger signal, a generation number setting unit 26 for the number of generated third trigger signals N, a division time setting unit 27 that equally divides the interval time, and the image display unit 31. The surface potential was measured using the amount of secondary electron emissions on the basis of the flow of measuring the surface potential similar to FIG. 15 of the fourth embodiment. As the setting conditions of the embodiment, the acceleration voltage Va, the current Ip of primary electrons, and the applied voltage Vr to the sample holder were 3000 V, 20 pA, and 2700 V, respectively, and the interval time T, the number of generated signals N, and the division time ΔT were 0.64 μs, 64, and 0.64 μs, respectively.

Figure 17:
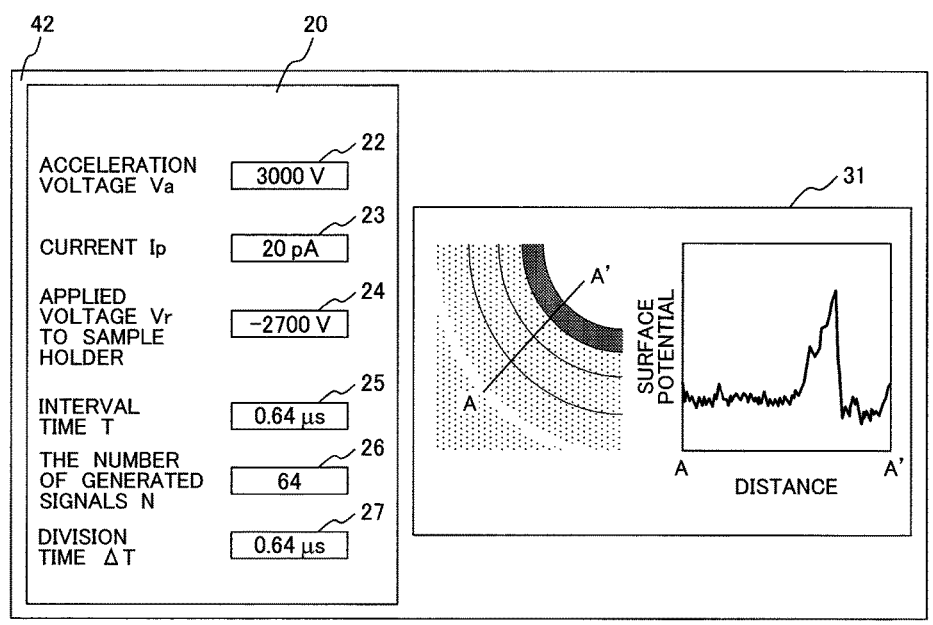
FIG. 17 is a diagram for showing an example of a GUI of the charged particle beam device according to the fifth embodiment.

A measurement result of the surface potential distribution of a sample obtained by applying electrical filed stress to an insulating film is shown in the image display unit 31 of FIG. 17. According to the embodiment, the surface potential distribution can be measured on the basis of the two-dimensional image using the amount of secondary electron emissions.

REFERENCE SIGNS LIST

1: electron gun, 2: deflector, 3: objective lens, 4: detector, 5: sample, 6: sample holder, 7: stage, 8: acceleration control unit, 9: current control unit of primary electrons, 10: deflection scanning signal control unit, 11: objective lens coil control unit, 12: stage control unit, 13: first trigger signal control unit, 14: second trigger signal control unit, 15: third trigger signal control unit, 16: detection control unit, 17: signal processing unit, 18: signal voltage conversion unit, 19: measurement result display unit, 20: operation interface, 21: GUI, 22: acceleration voltage setting unit, 23: current setting unit of primary electrons, 24: applied voltage setting unit to sample holder, 25: interval time setting unit, 26: generation number setting unit, 27: division time setting unit, 28: blanker, 29: blanker control unit, 30: image forming unit, 31: image display unit, 32: insulating film, 33: lower layer pattern, 34: SEM image, 35: SEM image, 36: SEM image, 37: SEM image, 38: GUI, 39: measurement result display unit, 40: surface potential measurement result display unit, 41: conversion unit to surface potential distribution, 42: GUI.

The invention claimed is:

1. A charged particle beam device comprising:
a charged particle source that generates a primary charged particle beam;
a stage on which a sample is put;
an acceleration voltage setting unit that sets the acceleration voltage of the primary charged particle beam;
an objective lens that focuses the primary charged particle beam to a sample;
a detector that detects secondary charged particles emitted from the sample;
a detection controller configured to extract detected signals obtained by the detector; and
a trigger signal controller configured to transmit a trigger signal to the detection controller, and
a division time setting unit;
wherein the detection controller is further configured to:
start the extraction of the detected signals using a first trigger signal generated by the trigger signal controller;
complete the extraction of the detected signals using a second trigger signal generated by the trigger signal controller;
sample the detected signals N times using N (N is a natural number) third trigger signals that are generated by the trigger signal controller and that equally divide an interval time T between the first trigger signal and the second trigger signal; and
measure the secondary charged particles by integrating and averaging the signals sampled in respective division times ΔT obtained by equally dividing the interval time T,
wherein a number of primary charged particles contained in the division time ΔT is a predetermined number that is larger than the minimum number of charged particles satisfying ergodicity.

2. The charged particle beam device according to claim 1, wherein the minimum number of charged particles satisfying ergodicity is an equal value between the time average of the detected signals and the ensemble average of the detected signals in the measurement, or values between the equal value and the square root of the number of signals sampled in the range of the division time ΔT.

3. The charged particle beam device according to claim 1, wherein N is the number of charged particles or larger contained in the primary charged particle beam within the interval time T.

4. The charged particle beam device according to claim 1, wherein a blanker that blocks the primary charged particle beam is further provided, and the blanker releases the blockage of the primary particle beam using the first trigger signal, and blocks the primary particle beam using the second trigger signal.

5. The charged particle beam device according claim 1, wherein a deflector that allows the primary charged particle beam to scan the sample is further provided, and the deflector starts the scanning using the first trigger signal.

6. The charged particle beam device according claim 1, wherein a blanker that blocks the primary charged particle beam and a deflector that allows the primary charged particle beam to scan the sample are further provided, and
the starting of the extraction of the detected signals, the release of the blockage of the primary particle beam by the blanker, and the starting of the scanning by the deflector in the detection controller are synchronized with each other by the first trigger signal.

7. The charged particle beam device according to claim 1, wherein the primary charged particle beam is an electron beam.

8. A charged particle beam measurement method in a charged particle beam device having a charged particle source that generates a primary charged particle beam, a stage on which a sample is put, an acceleration voltage setting unit that sets the acceleration voltage of the primary charged particle beam, an objective lens that focuses the primary charged particle beam onto a sample, a detector that detects secondary charged particles emitted from the sample, a detection controller configured to extract detected signals obtained by the detector, and a trigger signal controller configured to transmit a trigger signal to the detection controller, the method comprising:
  a step of starting the extraction of the detected signals using a first trigger signal generated by the trigger signal controller;
  a step of completing the extraction of the detected signals using a second trigger signal generated by the trigger signal controller;
  a step of sampling the detected signals N times using N (N is a natural number) third trigger signals that are generated by the trigger signal controller and that equally divide an interval time T between the first trigger signal and the second trigger signal; and
  a step of measuring the secondary charged particles by integrating and averaging the signals sampled in respective division times ΔT obtained by equally dividing the interval time T, and
  the division time ΔT is controlled in such a manner that the measured number of secondary charged particles becomes larger than the minimum number of charged particles satisfying ergodicity.

9. The charged particle beam measurement method according to claim 8, wherein the minimum number of charged particles satisfying ergodicity is an equal value between the time average of the detected signals and the ensemble average of the detected signals in the measurement, or values between the equal value and the square root of the number of signals sampled in the range of the division time ΔT.

10. The charged particle beam measurement method according to claim 8, wherein the N is the number of charged particles or larger contained in the primary charged particle beam within the interval time T.

11. The charged particle beam measurement method according to claim 8, wherein the charged particle beam device further includes a blanker that blocks the primary charged particle beam, and a step of allowing the blanker to release the blockage of the primary particle beam using the first trigger signal and a step of allowing the blanker to block the primary particle beam using the second trigger signal are further provided.

12. The charged particle beam measurement method according to claim 8, wherein the charged particle beam device further includes a deflector that allows the primary charged particle beam to scan the sample, and a step of allowing the deflector to start the scanning using the first trigger signal is further provided.

13. The charged particle beam measurement method according to claim 8, wherein the charged particle beam device further includes a blanker that blocks the primary charged particle beam and a deflector that allows the primary charged particle beam to scan the sample, and
  a step of synchronizing the starting of the extraction of the detected signals, the release of the blockage of the primary particle beam by the blanker, and the starting of the scanning by the deflector with each other using the first trigger signal is further provided.

14. The charged particle beam measurement method according to claim 8, wherein the primary charged particle beam is an electron beam.

* * * * *